(12) United States Patent
Parker

(10) Patent No.: US 6,452,869 B1
(45) Date of Patent: Sep. 17, 2002

(54) ADDRESS BROADCASTING TO A PAGED MEMORY DEVICE TO ELIMINATE ACCESS LATENCY PENALTY

(75) Inventor: Allan Parker, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/794,478

(22) Filed: Feb. 26, 2001

(51) Int. Cl.$^7$ .............................. G11C 8/00; G11C 16/04
(52) U.S. Cl. ................. 365/238.5; 365/185.12
(58) Field of Search ................. 365/238.5, 230.01, 365/230.03, 185.12

(56) References Cited

U.S. PATENT DOCUMENTS

| | | | |
|---|---|---|---|
| 5,625,601 A | * 4/1997 | Gillingham et al. | 365/238.5 |
| 5,848,025 A | * 12/1998 | Marietta et al. | 365/238.5 |
| 6,131,139 A | * 10/2000 | Kikuchi et al. | 365/230.04 |
| 6,295,231 B1 | * 9/2001 | Toda et al. | 365/230.08 |

* cited by examiner

Primary Examiner—Trong Phan

(57) ABSTRACT

A method for operating a memory device includes receiving a first page address and extracting a first addressed page defined by the first page address. The method further includes serially accessing the first addressed page, and, during serial access of the first addressed page, broadcasting a next page address to begin extraction of a next addressed page so that serial access of the next addressed page may immediately follow serial access of the first addressed page with no access latency period.

15 Claims, 4 Drawing Sheets

ADDRESS BROADCASTING TO A PAGED MEMORY DEVICE TO ELIMINATE ACCESS LATENCY PENALTY

BACKGROUND

The present invention relates generally to memory devices. More particularly, the present invention relates to a descending staircase read technique for a multi-level cell NAND flash memory device.

A variety of semiconductor memory devices have been developed for storage of information. Examples include volatile and nonvolatile memory. Nonvolatile memory provides a key advantage in that it retains stored data after power is removed from the device. One example of nonvolatile memory is flash memory. However, manufacture and operation of nonvolatile memory is generally more complex than for volatile memory. For all memory devices, important design goals include increased storage density and reduced read and write times.

A conventional memory device includes an array of storage cells or memory cells. Each cell stores a single binary digit or bit of information. For example, in a flash memory, the threshold voltage of a transistor in the memory cell is adjusted according to the data stored. During a read cycle, the threshold voltage is sensed to resolve the state of the data stored. In a conventional binary memory, this data is conventionally described as having a state of logic 0 or logic 1. The array of storage cells is surrounded by circuits for reading and writing data and controlling operation of the memory device.

One type of memory is a paged device, in which stored data is organized by pages. During a read operation, a page address is provided to the memory. After an initial read access latency time, the page of data becomes available for reading. The initial latency period may be very long, on the order of nanoseconds up to tens of microseconds, depending on the size of the page. The page size can be 8 to 16 words in size up to 512 words of data, each word being 16 bits in size. Each word of data is read at a specific cycle rate. The rate of the device is the data cycle time. The data cycle time is significantly smaller than the read access latency time.

The following example illustrates the contributions of read access latency time and data cycle time to read performance.

Total read time=access latency+N*data access cycle time, where N is the number of words in a page. Example:

51.8 µs=6 µs+512*100 ns

In conventional designs, each access to a non-contiguous page require the access latency time. In the above example, the latency reduces read performance by ten percent. A general design goal for all memory devices is reduction of the time required for reading and writing or programming data. Paged memories are popular because the average data access time can be relatively small by taking advantage of reading contiguous memory locations. Non-paged or randomly accessed memories always require a latency access time.

Some current designs allow for contiguous page reads without the latency delay. However, this benefit is obtained only if contiguous pages are read. If a non-contiguous page is required, the latency time is again encountered. It would be desirable to allow non-contiguous page accesses with no read access penalty.

BRIEF SUMMARY

By way of introduction only, a method for operating a memory device includes receiving a first page address and extracting a first addressed page defined by the first page address. The method further includes serially accessing the first addressed page, and, during serial access of the first addressed page, broadcasting a next page address to begin extraction of a next addressed page so that serial access of the next addressed page may immediately follow serial access of the first addressed page with no access latency period.

The foregoing discussion of the preferred embodiments has been provided only by way of introduction. Nothing in this section should be taken as a limitation on the following claims, which define the scope of the invention.

DETAILED DESCRIPTION OF THE PRESENTLY PREFERRED EMBODIMENTS

Figure 1:
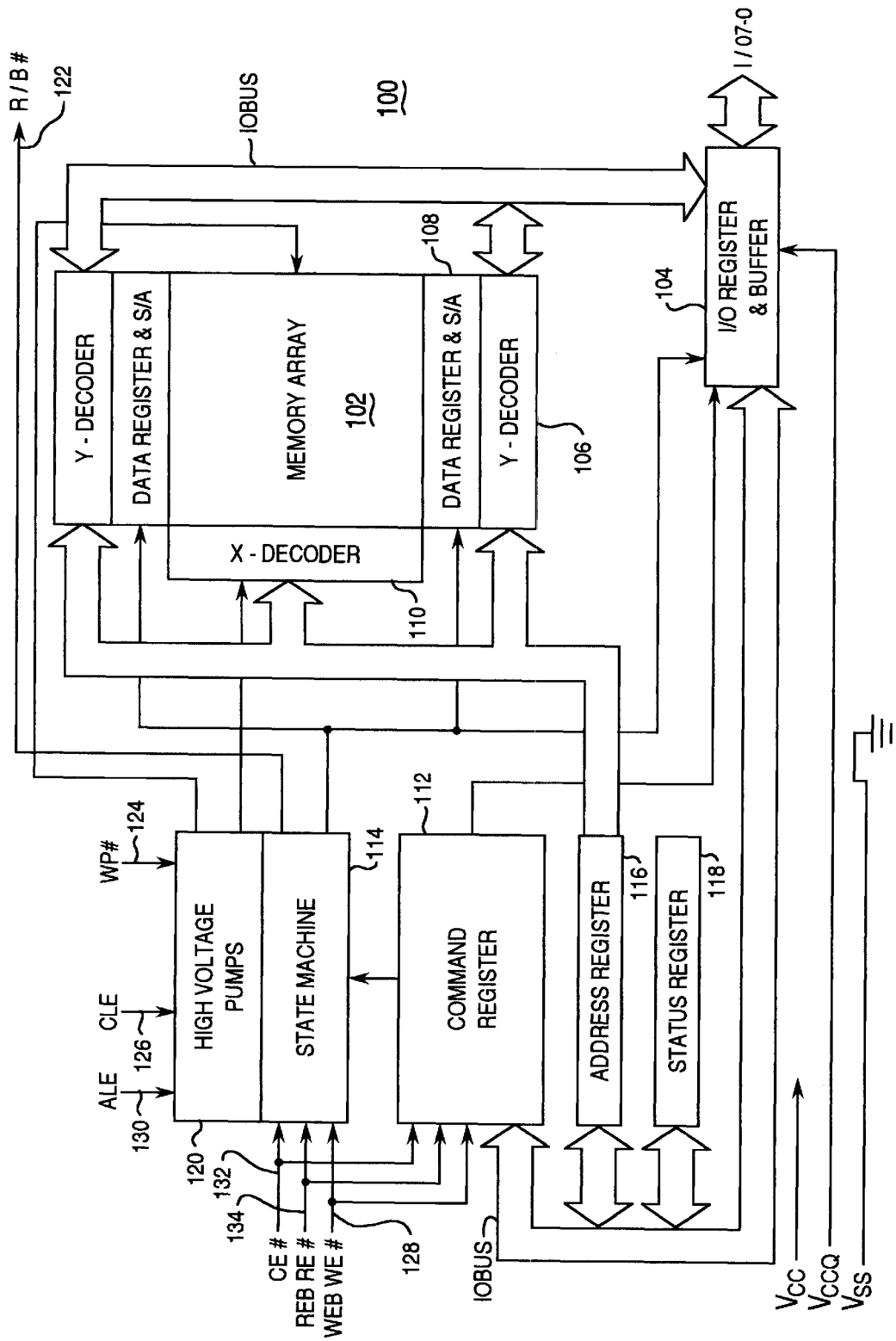
FIG. 1 is a block diagram of a memory device.

Referring now to the drawing, FIG. 1 shows a block diagram of a memory device 100. The memory device 100 in the illustrated embodiment is a NAND flash memory. However, in other embodiments, the memory device 100 may be any other suitable type of volatile memory such as random access memory (RAM) including static or dynamic RAM or nonvolatile memory such as EEPROM. Further, the memory device 100 may be an embedded memory circuit within another integrated circuit or device containing other circuitry, such as logic. As a flash memory, the memory device 100 may be written or programmed with data, read to retrieve the stored data, and erased to clear the memory device on a block-by-block basis.

The illustrated memory device 100 is a paged or page mode memory. A read command and a page address are provided to the memory device 100. There follows a latency time during which a page of data, such as 528 bytes, is transferred from the selected page. The data stored at the page address becomes available for reading, along with the remainder of the data on the accessed page. Subsequent read operations from the accessed page require only a sequential access time which is much less than the latency time.

In the illustrated embodiment, the memory device 100 includes a memory cell array 102, an input/output (I/O) register 104, one or more Y-decoders 106, one or more sense amplifier blocks 108 and one or more X-decoders 110. Further, the memory device 100 includes a command register 112, a state machine 114, an address register 116, a status register 118 and a high voltage circuit 120. Other embodiments of the memory device 100 may include other components or omit some of those illustrated in FIG. 1.

The memory cell array 102 includes a plurality of memory cells arranged in an ordered array of rows and columns. Each memory cell is independently addressable and may be programmed or written with data and read or sensed. In response to a received address, the X-decoder 110 selects one or more rows of the memory cell array 102 for access. Similarly, the Y-decoder 106 selects one or more columns of the memory cell array 102 for access. Sense amplifiers in the sense amplifier block 108 detect the state of the data stored in the accessed memory cell or cells. Data registers of the sense amplifier block 108 store data immediately prior to writing or immediately after reading the accessed memory cell or cells.

Address information and data to be stored, along with commands for controlling operation of the memory device 100, are provided to the memory device 100 using the I/O register 104 in a time multiplexed manner known in the art. Commands are written to the command register 112 using the I/O register 104. Address information corresponding to one or more memory cells to be accessed is stored in the address register 116. Status information is stored in the status register 118. Register contents serve as inputs to the state machine 114 which controls read, erase and programming of the memory device 100. The state machine 114 performs embedded operations to complete reading, erasing and programming automatically without user interaction.

Figure 2:
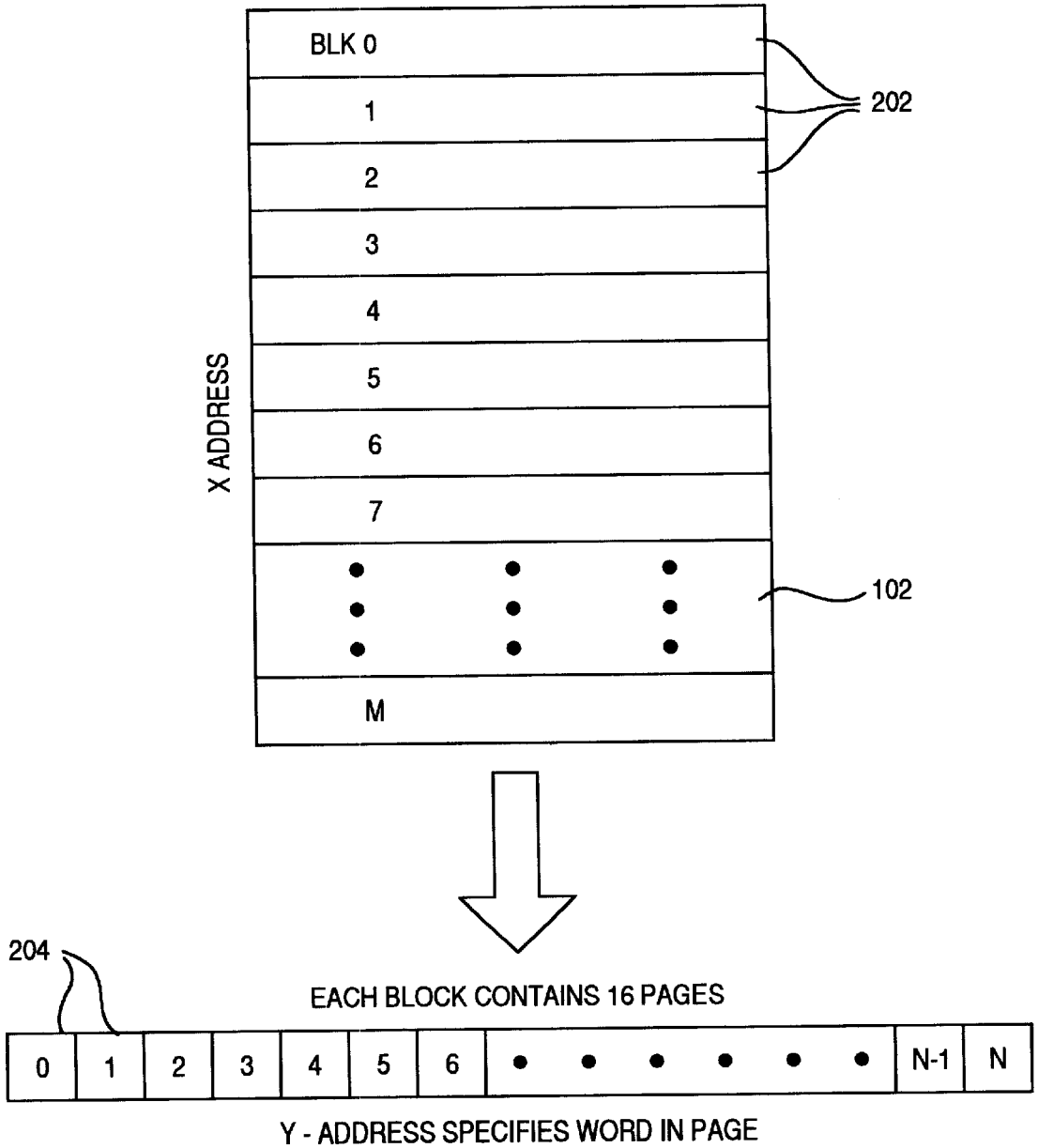
FIG. 2 is a block diagram illustrating addressing and organization in the memory device of FIG. 1.

FIG. 2 is a block diagram addressing and organization in the memory device of FIG. 1. The memory cell array 102 includes multiple pages. In one example, there are more than 16K pages, each page 512 bytes in size. By way of example, the page address can be referred to as the X address and the address of a specific byte within a page is the Y address. This is shown in FIG. 2. The memory cell array 102 is divided in to M blocks 202. Each block contains W=16 pages 204. Each page contains N=512 words. The total memory size is thus M blocks*N words*W pages. These sizes and this organization is exemplary. Other sizes and organizations may be implemented. For example, some memory devices have page sizes of only 8 or 16 words.

Referring again to FIG. 1, reading data is done according to standard NAND flash operation. A starting address is provided to the I/O register 104 along with the appropriate command. The associated memory cells are accessed and a page of data is transferred to the I/O register 104. A page may be any suitable size, such as 264 bytes. The 264 bytes in this example includes 256 bytes of storage area and 8 bytes of spare area. After an initial page read access time, such as 6 microseconds, the memory device 100 under control of the state machine 114 automatically increments the address register to the next address location in response to a received clock signal. Reading will be discussed in greater detail in conjunction with FIGS. 3 and 4.

Erasing operations are performed on a block basis. A block may be any suitable size, such as 16 rows by 256 words per row. The state machine 114 initiates an embedded erase algorithm to automatically time erase pulse widths and verify proper cell erase margin.

The memory device 100 signals completion of an operation such as a read, write or erase using a read/busy pin 122. The signal at the ready/busy pin 122 indicates operation status of the memory device 100. When this signal is high, the memory device 100 is ready to accept commands and data for a next operation. When the signal at the pin 122 is low, an internal operation is in progress.

To complete the identification of elements shown in FIG. 1, the high voltage circuit 120 generates the voltages necessary for proper reading, programming and erasure of the memory device 100. The memory device 100 operates in response to power supply (Vcc and Vccq) and ground (Vss) voltages. Typical power supply voltage is 3.0 volts, but other voltages may be used.

A write protect input pin 124 provides hardware data protection. When a write protect signal is asserted at pin 124, program and erase operations are inhibited.

A command latch enable (CLE) pin 126 receives a signal which controls activation of the command register 112 for the receipt of commands. When this signal is high, the command is latched into the command register 112 on the rising edge of the write enable signal received at the write enable pin 128. A signal at an address latch enable (ALE) input 130 controls activation of the address register 116 during a data input operation. When the ALE signal is high, the address information is latched on the rising edge of the write enable signal at pin 128. When ALE is low, the input data information is latched on the rising edge of the write enable signal. The signal at the chip enable input 132 controls the mode, either active or standby, of the memory device 100. The signal at the read enable input 134 controls serial data output and status from the input/output lines. Lastly, the signal at the spare area enable input 136 controls access to a spare storage area on each page. When the spare area signal is high, the spare area is not enabled.

Figure 3:
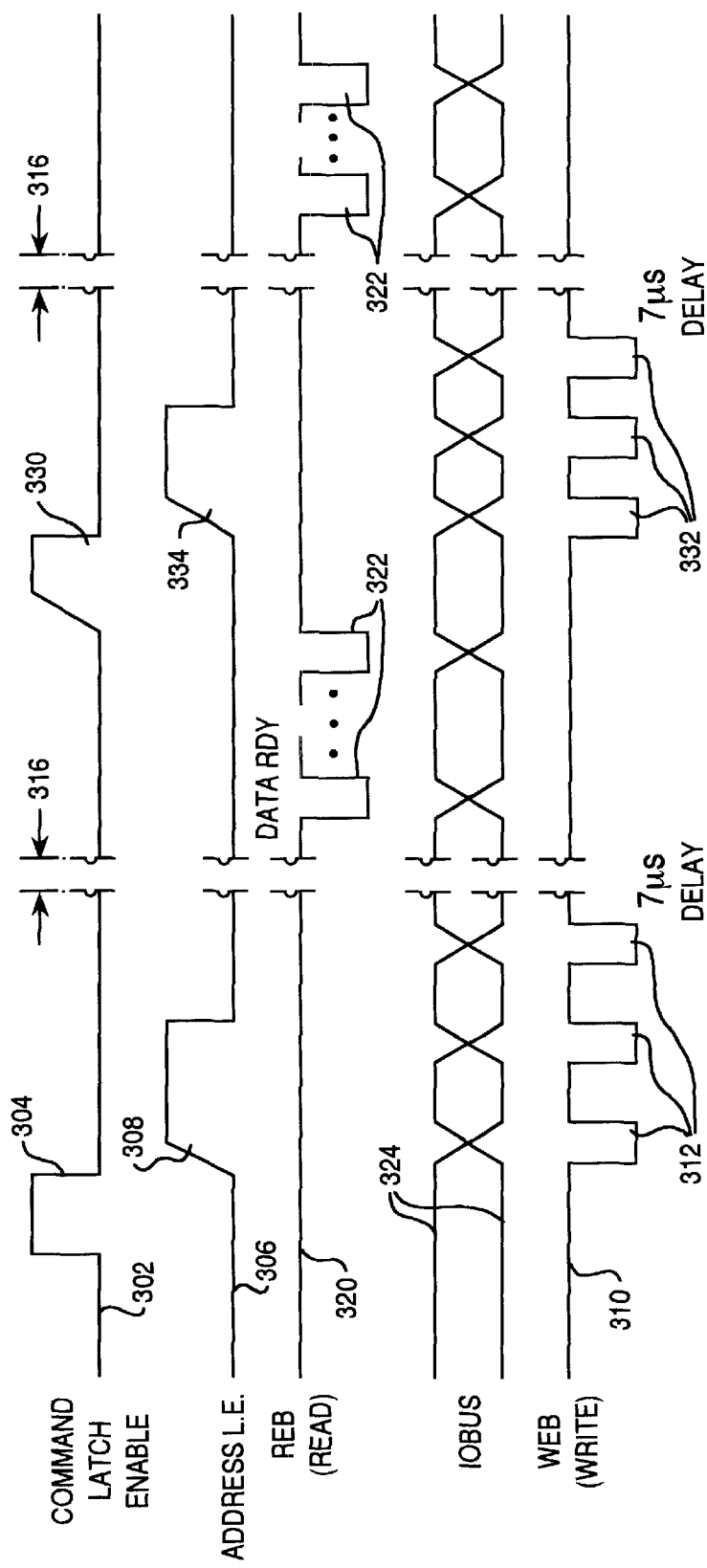
FIG. 3 is a timing diagram illustrating a page access in a conventional memory.

FIG. 3 is a timing diagram illustrating a page access in a conventional memory. A read cycle begins when the command latch enable signal (CLE) 302 is asserted. When the command latch enable signal 302 has a positive-going pulse 304, a read command is latched into the command latch from the I/O pins. Subsequently, the address latch enable (ALE) signal 306 is asserted in a positive-going pulse 308 to latch the page address into the memory device 100. While the address latch enable signal 306 is held high, a three byte page address is latched in one byte at a time. The write enable signal (WEB) 310 is asserted three times 312 to write the address.

A latency access period 316 follows as one page of data is retrieved from the memory cell array 102 to the I/O register 104. The duration of the latency access period 316 depends on the configuration and size of the memory device. In FIG.3, the latency access period 316 has a duration of 7 $\mu$s. After the latency access period 316, data from the accessed page is ready for reading. The read enable signal (REB) 320 is repeatedly asserted as a series of negative-going pulses 322. After a read enable access time, valid data is available on the input/output bus 324. The read enable signal 320 is asserted until all data are clocked from the page.

During a subsequent read cycle, the cycle is again started by assertion of the command latch enable signal 302. A positive-going pulse 330 on this signal latches a read command into the command latch. A pulse 334 on the address latch enable signal 306 activates the address latch to store a next page address. Three subsequent pulses 332 on the write enable signal latch in the three bytes of the address from the I/O bus 324.

Again, a latency access period 316 as a next, non-contiguous page of data is retrieved from the memory cell array 102 to the I/O register 104. After the latency access period 316, data from the access page is ready for reading. The read enable signal (REB) 320 is repeatedly asserted as a series of negative-going pulses 322. After a read enable access time, valid data is available on the input/output bus 324. The read enable signal 320 is asserted until all data are clocked from the page.

Thus, in the conventional operation of a memory device as illustrated in FIG. 3, a latency access period penalty is experienced every time a non-contiguous page is read. As noted above, this penalty may be ten percent of the read cycle time.

Figure 4:
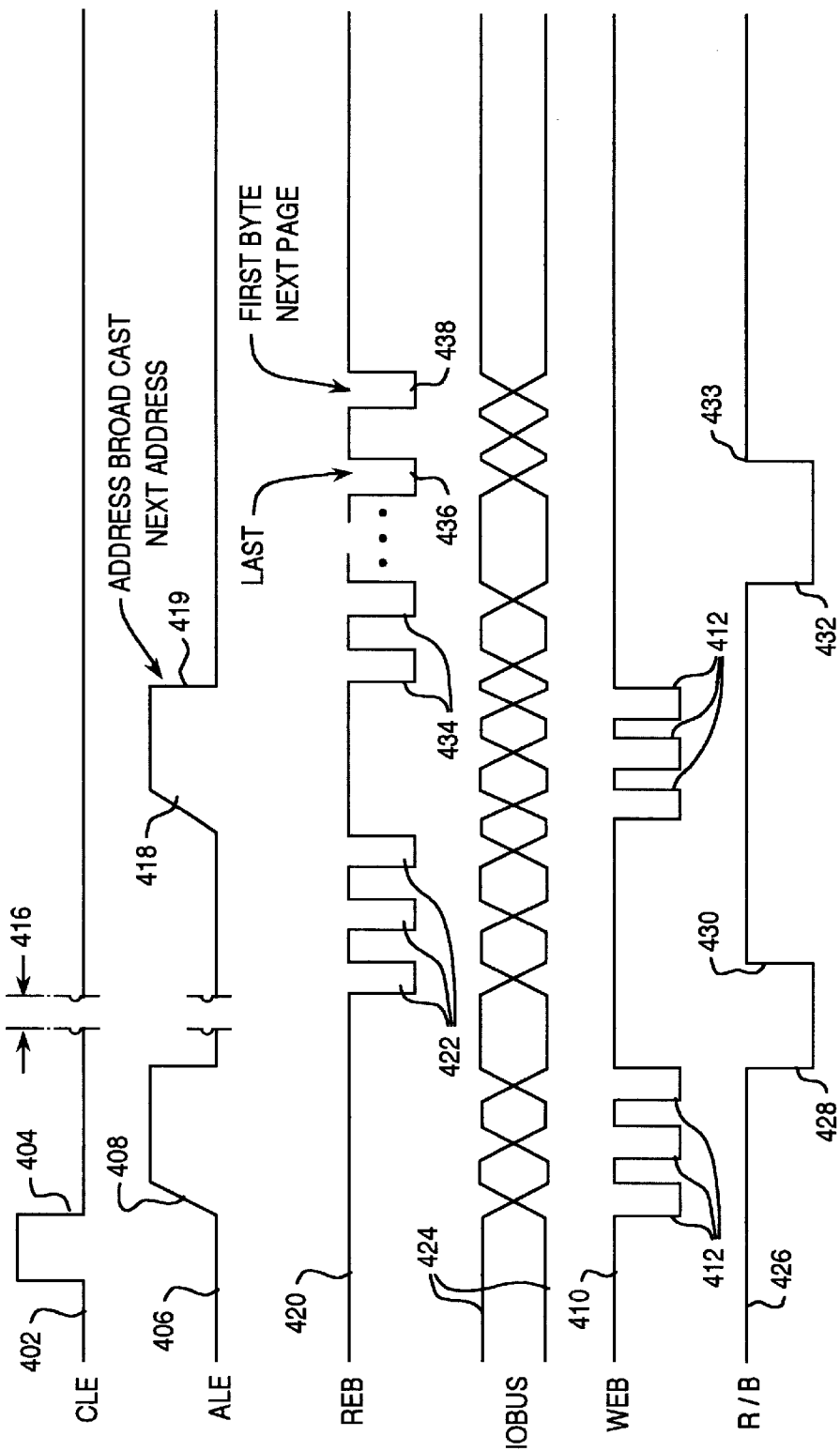
FIG. 4 is a timing diagram illustrating a page access in the memory device of FIG. 1.

FIG. 4 is a timing diagram illustrating a page access in the memory device 100 of FIG. 1. In the page access of FIG. 4, address broadcasting is used to eliminate the latency access period from all but the initial page read cycle.

As shown in FIG. 4, a read cycle begins when the command latch enable signal 402 is asserted. During this portion of the read cycle, the ready/busy (R/B) signal 426 provided by the memory device at the R/B pin 122 (FIG. 1) is high, indicating the memory device 100 is ready to accept the next operation. A positive going pulse 404 on the command latch enable signal 402 latches in the read command from the I/O bus 424. The address latch enable signal (ALE) 406 is then asserted with a positive-going pulse 408 to activate the address latch. The write enable signal (WEB) is asserted as three pulses 412 to latch in the three bytes of the page address from the I/O bus 424.

After the final write enable pulse 412, the ready busy signal 426 goes to a logic low level 428, indicating that an internal operation is in progress. In this case, the internal operation is the retrieval of the page of data from addresses starting with the page address just provided. The memory device 100 begins an embedded operation to access a page of data from the core cell array 102 as defined by the page address. During this time, no data or address or other information can be provided to the memory device 100, which is busy.

After a latency access period 416, the ready/busy signal 426 returns to a logic high level 430. The read enable signal (REB) 420 is then asserted as a series of negative-going pulses 422. Data from the accessed page is then sequentially read out to the I/O bus 424. The read enable signal 420 acts like a clock signal, automatically incrementing the address to be read with each pulse 422. Serial read access, defined by the repeated pulsing of the read enable signal 420 to serially access data from the specified page, continues in this fashion.

At any time during the serial read access, when the ready/busy signal 426 is high, an address broadcast of a next page address occurs. The address latch enable signal 406 is driven high in a positive-going pulse 418. With the address latch enable signal 406 high, the write enable signal 410 is asserted to latch in the next page address. The next page address defines the next addressed page, which is generally not a sequential page relative to the current page. Address information at the I/O bus 424 is latched on the rising edge of the pulses 412 of the write enable signal 410. In the illustrated example, a three byte next page address is entered while the address latch enable signal 406 is high during the pulse 418.

After the pulse 418 of the address latch enable signal 406, the next page address is broadcast internally to the memory 100 for extraction of the next addressed page from the memory cell array 102. The memory device 100 uses the next page address to initiate the embedded page access operation. During the embedded operation, all data stored on the next addressed page is extracted from the next addressed page by reading the data and writing it to the I/O register. To indicate that the embedded operation is in progress, the ready/busy signal 426 is driven low in a negative-going pulse 432. The ready/busy signal 426 remains low throughout the duration of the embedded operation. Following completion of the embedded operation, the ready/busy signal 426 returns to a logic high level 433 indicating the memory is ready to accept the next operation.

After falling edge 419 of the pulse 418 of the address latch enable signal 406, the read access of the first page resumes.

Additional pulses 434 of the read enable signal 420 are asserted to continue the serial read access. For each pulse 434, a next byte of data is provided to the I/O bus 424 and the serial access address is automatically incremented. This continues until a last pulse 436 of the read enable signal 420 is asserted and the last byte of data from the first page is provided.

In accordance with the present embodiments, upon assertion of a next pulse 438 of the read enable signal 420, the first byte of data from the next addressed page is provided to the I/O bus 424. Here, the next addressed page is the page specified by the next page address supplied during assertion of pulse 418 of the address latch enable signal 406. The next pulse 438 of the read enable signal 420 may be asserted with identical timing to pulses 434, 436 which clocked out data from the first addressed page of memory. Preferably, the page boundary is crossed seamlessly with no timing penalty. Most importantly, the latency access period is avoided for all page accesses except the first page access. This substantially improves the performance of the memory device 100.

In one embodiment, if no next address is supplied during the serial read of a current page so that no address broadcasting occurs, the page extracted during the serial read access will be the next sequential or contiguous page. That is, the page address will be automatically incremented and the next sequential page addressed by the incremented address will be extracted from the memory cell array 102. Again, in this instance, the page boundary is preferably crossed with no timing penalty, including no latency access time.

From the foregoing, it can be seen that the present embodiments provide an improved method and apparatus for paged access of a memory device. During serial access of a first accessed page, an address is broadcast to begin extraction of a next addressed page so that serial reading of data from the next addressed page may immediately follow serial reading of data from the first accessed page with no access latency period. The system broadcasts the next page during the current read cycle. This allows data transfer with no timing penalty. If no next page address is provided, in one embodiment the next contiguous page is automatically extracted.

While a particular embodiment of the present invention has been shown and described, modifications may be made. For example, while an exemplary embodiment has been shown as a flash memory device, any memory operable in page mode may be configured as illustrated and described herein. It is therefore intended in the appended claims to cover all such changes and modifications which fall within the true spirit and scope of the invention.

What is claimed is:

1. A method for operating a memory device, the method comprising:

receiving a first page address;

extracting a first addressed page defined by the first page address;

serially accessing the first addressed page; and during serial access of the first addressed page, broadcasting a next page address to begin extraction of a next addressed page so that serial access of the next addressed page may immediately follow serial access of the first addressed page with no access latency period.

2. The method of claim 1 wherein receiving the first page address comprises:

receiving an assertion of an address latch enable signal;

receiving the first page address as a plurality of bytes during the assertion of the address latch enable signal.

3. The method of claim 2 further comprising:

during serial access of the first addressed page, receiving a next assertion of the address latch enable signal;

receiving the next page address during the next assertion of the address latch enable signal; and using the next page address, extracting the next addressed page for serial access.

4. The method of claim 1 wherein serially accessing the first addressed page comprises:

receiving pulses of a read enable signal; p1 in response to the pulses, providing next data from a current address to an output of the memory device; and automatically incrementing the current address.

5. The method of claim 4 wherein automatically incrementing comprises:

upon reaching an end address of the first addressed page, changing the current address to match a beginning address of the next addressed page.

6. The method of claim 1 further comprising:

during serial access of the first addressed page, accepting the next page address;

broadcasting the next page address; and if no next page address is offered, broadcasting a next sequential page address to begin extraction of the next sequential page so that serial access of the next sequential page may immediately follow serial access of the first addressed page with no access latency period.

7. A memory device comprising:

a memory cell array including a plurality of pages;

means for receiving a page address defining a page for read access;

means for receiving a read enable signal controlling output of data from the page for read access;

means for receiving, during output of the data, a next page address; and means for providing next page data from the next page immediately after exhaustion of data from the page for read access.

8. The memory device of claim 7 further comprising:

means for broadcasting the next page address to extract the next page data from the memory cell array.

9. The memory device of claim 7 further comprising:

address latch enable input configured to receive an address latch enable signal; and an address register to receive the next page address during receipt of the address latch enable signal.

10. The memory device of claim 7 further comprising:

means for providing sequential page data from a sequential page if no next page address is received by the means for receiving.

11. A method for reading pages of data from a memory, the method comprising:

receiving a read command;

receiving a first page address defining a first page for reading;

receiving an address latch enable signal to control latching of the first page address;

receiving a series of read enable pulses;

in response to respective read enable pulses,
providing data from the first page, the data having a data address, and
automatically incrementing the data address to a next data address;

receiving the address latch enable signal to control latching of a next page address;

extracting next page data from a next page defined by the next page address; and after providing last data from the first page, providing first data from the next page.

12. The method of claim 10 wherein providing first data from the next page comprises:

providing the last data from the first page in response to a received read enable pulse; and providing the first data from the next page in response to a next received read enable pulse without substantial timing penalty.

13. The method of claim 11 further comprising:

determining if the address latch enable signal is received to control latching of a next page address;

if not, identifying a next page address to access according to predetermined criteria.

14. The method of claim 13 wherein identifying a next page address to access comprises selecting a next sequential page to access.

15. The method of claim 14 wherein selecting a next sequential page comprises incrementing a page address in an address register.

* * * * *